United States Patent [19]
Thomas et al.

[11] Patent Number: 5,383,484
[45] Date of Patent: Jan. 24, 1995

[54] STATIC MEGASONIC CLEANING SYSTEM FOR CLEANING OBJECTS

[75] Inventors: Huw K. Thomas, West Chester; Roger A. Carolin, Malvern; Heinrich S. Erhardt, Downingtown; Christopher F. McConnell, Berwyn, all of Pa.

[73] Assignee: CFMT, Inc., Wilmington, Del.

[21] Appl. No.: 93,116

[22] Filed: Jul. 16, 1993

[51] Int. Cl.$^6$ .................................. B08B 3/12
[52] U.S. Cl. .................................. 134/184; 134/1; 134/902
[58] Field of Search ............ 134/902, 184, 1; 68/355

[56] References Cited

U.S. PATENT DOCUMENTS

| | | | |
|---|---|---|---|
| 2,950,725 | 8/1960 | Jacke et al. | 134/1 X |
| 3,371,233 | 2/1968 | Cook | 134/184 X |
| 4,118,649 | 10/1978 | Shwartzman et al. | 134/902 X |
| 4,311,157 | 1/1982 | Jubenville et al. | 134/184 X |
| 4,543,130 | 9/1985 | Shwartzman | 134/1 |
| 4,778,532 | 10/1988 | McConnell et al. | 134/10 |
| 4,804,007 | 2/1989 | Bran | 134/184 |
| 4,869,278 | 9/1989 | Bran | 134/184 |
| 4,911,761 | 3/1990 | McConnell et al. | 134/11 |
| 4,917,123 | 4/1990 | McConnell et al. | 134/95 |
| 4,979,994 | 12/1990 | Dussault et al. | 134/1 |
| 4,984,597 | 1/1991 | McConnell et al. | 134/95 |
| 5,017,236 | 5/1991 | Moxness et al. | 134/1 |
| 5,037,481 | 8/1991 | Bran | 134/1 |
| 5,090,432 | 2/1992 | Bran | 134/139 |
| 5,133,376 | 7/1992 | Samarin et al. | 68/3 SS X |
| 5,143,103 | 9/1992 | Basso et al. | 134/98.1 |
| 5,148,823 | 9/1992 | Bran | 134/184 |
| 5,201,958 | 4/1993 | Breunsbach et al. | 134/902 X |

FOREIGN PATENT DOCUMENTS

| | | | |
|---|---|---|---|
| 44323 | 2/1992 | Japan | 134/902 |
| 49619 | 2/1992 | Japan | 134/902 |

*Primary Examiner*—Philip R. Coe
*Attorney, Agent, or Firm*—Panitch Schwarze Jacobs & Nadel

[57] ABSTRACT

A static megasonic cleaning system for cleaning multiple objects having an exterior surface includes a cassetteless vessel having an internal cavity for receiving the multiple objects and an array of megasonic transducers mounted on the vessel. Each transducer emits a focused beam of megasonic energy into the cavity and is arranged so that the emitted beams from all of the transducers collectively envelop the entire exterior surface of the objects. The transducers are staggered to avoid internal mounting structure within the vessel and avoid unnecessary dissipation of the megasonic energy.

15 Claims, 2 Drawing Sheets

STATIC MEGASONIC CLEANING SYSTEM FOR CLEANING OBJECTS

FIELD OF THE INVENTION

The present invention relates generally to systems for cleaning objects requiring high levels of cleanliness and, more particularly, to static megasonic cleaning systems using high frequency vibrating energy in a cleaning liquid to clean semiconductor wafers and the like.

BACKGROUND OF THE INVENTION

Megasonic cleaning systems for cleaning semiconductor wafers utilize megasonic energy from transducers which cause a vibratory beam to be propagated into certain chemical cleaning solutions. Megasonic transducers produce a focused beam and create high shear forces at the wafer surface to assist in removing particles from the surface of semiconductor wafers during all processing steps. The beam of energy also removes organic surface films, ionic impurities, and many other contaminants.

Some prior art cleaning systems for semiconductor wafers employ a megasonic transducer at the bottom of a cleaning vessel containing a cleaning solution. A cassette-type holder carries a plurality of wafer substrates in spaced, parallel relation within the vessel. Since the megasonic transducer beam must pass through the cassette holder to engage the wafers, the energy transferred is dissipated by the holder. Thus, the cassette holder reduces the amount of energy transferred to the surfaces of the wafers. Further, the transducer beam does not cover the entire surface area of the wafers and overlaps the wafers in some regions. Thus, some foreign particles are not dislodged by the prior art systems.

In other arrangements similar to the above-mentioned cleaning systems, it is necessary to move the cassette-type holder within the vessel in order to increase the exposure of the surfaces of the wafers to the megasonic energy. An apparatus is needed for moving the holder within the vessel, together with controls for controlling the rate and duration of the movement. Both the moving apparatus and the controls add considerable expense to the cleaning system. Further, since the container must be sufficiently large to accommodate this movement of the holder, vessel expense is significant, and more importantly, it is necessary to provide additional cleaning solution within the vessel.

In yet another prior art megasonic cleaning system, a module is specifically designed to process a single wafer substrate. The module comprises a substrate chamber closely sized to the dimensions of the wafer substrate for maintaining the substrate immersed in a liquid cleaning solution. A high frequency sonic wave generating transducer is maintained outside the substrate chamber for vibrating the cleaning solution at ultrasonic frequencies. The substrate chamber is provided with membranes formed of a material, such as FEP Teflon®, which is inert to the cleaning solutions being used. The single wafer is supported within the chamber on its periphery by support members to minimize surface contact and have the surfaces of the wafer substrate exposed to the cleaning solution and the sonic wave.

A first disadvantage with this particular megasonic cleaning system is that the module is specifically designed to process only one wafer substrate at a time. To process a plurality of wafer substrates simultaneously, a plurality of individual modules must be incorporated into a single processing system. However, this would result in a complex system involving high costs and multiple, time consuming processes. A second disadvantage involves the transducer having to transmit a beam of energy through the support members. This causes the energy transmitted to be dissipated and, therefore, reduces the cleaning efficiency of the beam of energy.

The present invention overcomes many of the disadvantages inherent in the above-described prior art cleaning systems by providing a megasonic cleaning system which can simultaneously process a plurality of wafer substrates. The megasonic cleaning system of the present invention employs a cassetteless vessel with an internal cavity defined by an internal surface for accommodating a plurality of substrate wafers and one or more standard cleaning solutions. The wafers are supported within the vessel by mounting members to minimize surface contact and have all surfaces of the wafers exposed to the cleaning liquid and the sonic waves. A number of megasonic wave generating transducers are placed around the exterior of the vessel. The transducers are staggered on opposite sides of the vessel such that the transducer beams are not transmitted through the mounting members, thereby allowing the transmitted beams to collectively envelop the entire surface area of the wafers without energy dissipation caused by intervening structure.

SUMMARY OF THE INVENTION

Briefly stated, the present invention is for a static megasonic cleaning system for cleaning a plurality of objects having an exterior surface. The megasonic cleaning system comprises a cassetteless vessel having an internal cavity defined by an internal surface for receiving the plurality of objects and a cleaning fluid. An array of megasonic wave generating transducers is mounted on the vessel outwardly of the internal surface. Each of the transducers emit a focused beam of megasonic energy into the cavity. The plurality of transducers are arranged so that the emitted beams collectively envelop the entire exterior surface of each object.

The megasonic cleaning system also comprises a vessel having an internal cavity defined by an internal surface for receiving the plurality of objects and a plurality of different fluids. An array of megasonic wave generating transducers are mounted on the vessel outwardly of the internal surface. Each of the transducers emit a focused beam of megasonic energy into the cavity. The plurality of transducers are arranged so that the emitted beams collectively envelop the entire exterior surface of each object.

The megasonic cleaning system also comprises a vessel having an internal cavity defined by an internal surface for receiving the plurality of objects. The vessel includes at least two mounting members extending inwardly from the internal surface for engaging and supporting the objects within the cavity. The mounting members are spaced with respect to each other. An array of megasonic wave generating transducers are mounted on the vessel outwardly of the internal surface. Each of the transducers emit a focused beam of megasonic energy into the cavity. Each transducer is mounted on the vessel such that each focused beam of megasonic energy passes directly from the internal surface to the objects without impacting upon the mounting members.

BRIEF DESCRIPTION OF THE DRAWINGS

The foregoing summary, as well as the following detailed description of a preferred embodiment of the invention, will be better understood when read in conjunction with the appended drawings. For the purpose of illustrating the invention, there is shown in the drawings an embodiment which is presently preferred. It should be understood, however, that the invention is not limited to the precise arrangements and instrumentalities shown. In the drawings.

DETAILED DESCRIPTION OF PREFERRED EMBODIMENTS

Figure 1:
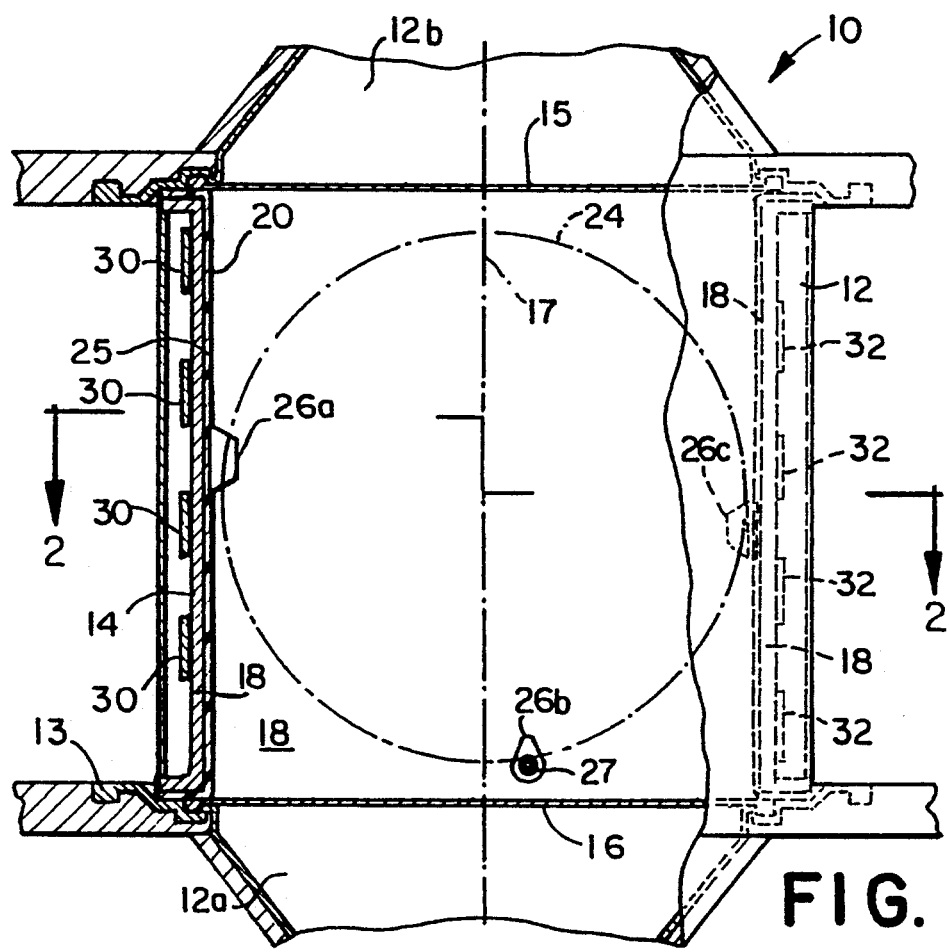
FIG. 1 is a side elevational view, partially in cross-section, of a static megasonic cleaning system in accordance with the present invention.

Referring now to the drawings in detail, wherein like numerals indicate like elements throughout, there is shown in FIGS. 1-4 a preferred embodiment of a static megasonic cleaning system, generally designated 10, in accordance with the present invention. Referring now to FIG. 1, the static megasonic cleaning system 10 comprises a cleaning vessel 12 supported in place by a conventional mounting frame arrangement 13. The details of the mounting frame arrangement 13 are not pertinent to the present invention and are well understood by those skilled in the art. Accordingly, further description thereof is omitted for purposes of convenience only and is not limiting.

The vessel 12 is of the full flow type and includes an inlet 12a and an outlet 12b (partially shown) in fluid communication with a wet processing cleaning system of the type disclosed in U.S. Pat. Nos. 4,577,650, 4,633,983, 4,778,532, 4,911,761, 4,917,123, 4,984,597 which are hereby incorporated by reference.

Figure 2:
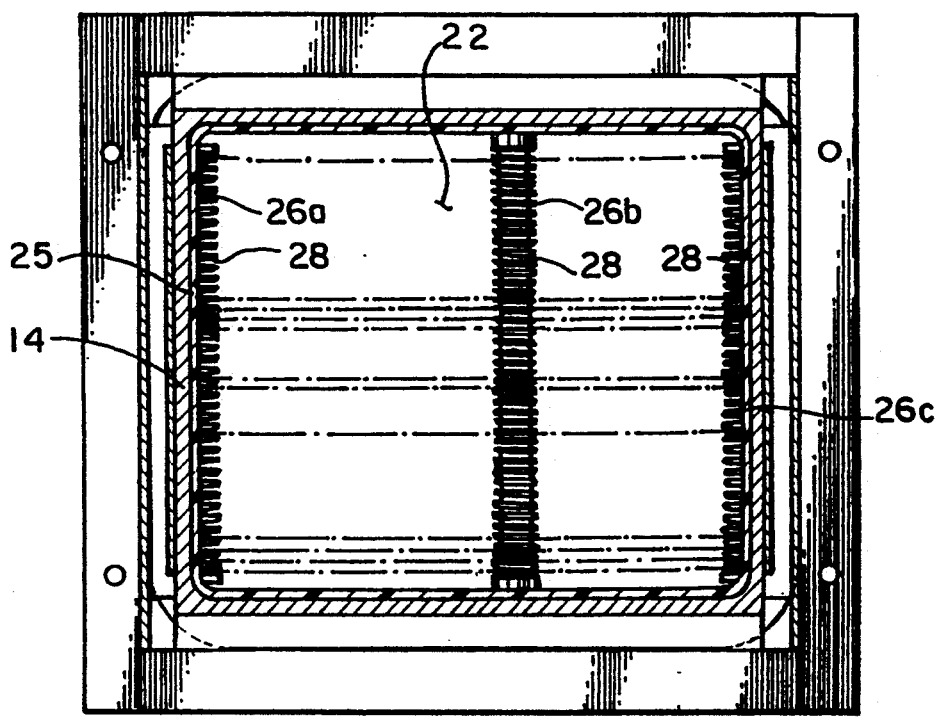
FIG. 2 is a cross-sectional view of the static megasonic cleaning system shown in FIG. 1 taken along lines 2—2 of FIG. 1.

As shown in FIGS. 1 and 2, in the present embodiment, it is preferred that the vessel 12 be cassetteless and have an internal cavity 22 for receiving a plurality of objects 24 (shown in phantom) and for receiving a fluid (not shown). More particularly, the vessel 12 includes a first end 15, a second end 16 and four interconnecting walls 18 extending between the first end 15 and the second end 16. The vessel 12 includes a longitudinal axis 17 centrally disposed between the walls 18 and extending between the first end 15 and the second end 16. Each of the walls 18 has an internal surface 20 which defines the internal cavity 22. In the present embodiment, the walls 18 are generally planar and the cavity 22 is generally in the form of a parallepiped. It is understood by those skilled in the art that the walls 18 and cavity 22 could be of any geometrical configuration in order to accommodate the type and number of the objects 24 being cleaned. For instance, the cavity 24 could be generally cylindrically shaped without departing from the spirit and scope of the invention.

In the present embodiment the walls 18 of the vessel 12 are preferably formed of a high strength light weight material, such as aluminum. However, it is understood by those skilled in the art that other materials, such as steel or iron, which provide for a rigid vessel structure while being capable of receiving megasonic energy therethrough could be used without departing from the spirit and scope of the invention. The walls 18 are preferably separately formed and secured together using standard hardware. Although it is understood that the vessel 12 could be cast or manufactured as a single unit.

Referring now to FIGS. 1 and 2, in the present embodiment the objects 24 are preferably solid and generally planar, such as semiconductor wafers. However, it is understood by those skilled in the art that the present invention is not limited to cleaning any particular objects. For instance, the objects 24 could be glass substrates or glass plates without departing from the spirit and scope of the present invention.

In the present embodiment, it is preferred that the vessel 12 receive a plurality of different cleaning fluids or solutions particularly suited for cleaning the type of objects 24 positioned with in the vessel 12. Where the objects 24 are semiconductor wafers it is preferred that the cleaning solutions be those listed in the above-identified patents which are incorporated by reference, such as a hot corrosive fluid, like sulfuric acid. However, it is understood by those skilled in the art that the present invention is not limited to any type of cleaning or rinsing fluids since the particular type of fluid being used depends upon the type of objects being cleaned.

As best shown in FIGS. 1 and 2, the internal surface 20 is comprised of a liner 25 which is in substantial facing engagement with the walls 18. The liner 25 is preferably constructed of a material which is chemically inert to all of the cleaning solutions used within the internal cavity 22. In the present embodiment, it is preferred that the liner 25 be constructed of a Teflon ® based material, such as rotomolded Tefzel ®. However, it is understood by those skilled in the art that other chemically inert materials could be used to construct the liner 25, such as polychlorotetrafluoroethylene (KEL-F ®), without departing from the spirit and scope of the invention.

In the present embodiment, it is preferred that the liner 25 be adhesively secured to the walls 18 of the vessel 12, in a manner well understood by those skilled in the art. Accordingly, further description thereof is omitted for purposes of convenience only and is not limiting.

As shown in FIGS. 1 and 2, the vessel 12 includes first, second and third mounting members 26a, 26b, 26c, respectively, extending inwardly from the internal surface 20 of the walls 18 for engaging and supporting the objects 24 within the cavity 22. As best shown in FIG. 1, each of the mounting members 26a, 26b, 26c is generally elongate and extends the width of the cavity 22 generally perpendicular to the longitudinal axis 17. The mounting members 26a, 26b, 26c are spaced with respect to each other along the longitudinal axis 17. The first mounting member 26a and the third mounting member 26c extend across opposing walls 18 of the vessel 12 such that they are in facing relation. The second mounting member 26b is positioned below the first and third mounting members 26a, 26c and extends between the other of the opposing walls 18 of the vessel 12 for supporting the bottom of the objects 24.

As shown in FIG. 2, each mounting member 26a, 26b, 26c includes a plurality of grooves 28 extending along the length thereof for receiving a corresponding plurality of objects 24. The grooves 28 are arranged to support the objects 24 at their periphery at three different contact points. The objects 24 are loosely fit within the grooves 28 to minimize the contact area between the mounting members 26a, 26b, 26c and the objects 24 to increase the exposure of the objects 24 to the fluids within the vessel 12 and the megasonic energy. The mounting members 26a, 26b, 26c disposed within the cavity 22 allow the objects 24 to be placed within the cavity 22 without the need for a cassette holder (not shown) and, therefore, render the vessel 12 cassetteless.

In the present embodiment, it is preferred that the first, second and third mounting members 26a, 26b, 26c be constructed of a material which is chemically inert to all of the fluids used in the cavity 22. In the present embodiment, it is preferred that the first, second and third mounting members 26a, 26b, 26c be constructed of a Teflon ®-based material, such as Tefzel ®. The second mounting member 26b includes a support rod 27 centrally disposed therein for providing the second mounting member 26b with rigidity. The support rod 27 is preferably constructed of a high strength lightweight material, such as steel, although other materials could be used, such as aluminum, to construct the support rod 27 without departing from the spirit and scope of the invention.

In the present embodiment, it is preferred that the first, second and third mounting members be secured to the walls 18 by a welding process well understood by those skilled in the art. However, other methods of attachment, such as standard hardware or adhesives, could be used to secure first, second and third mounting members 26a, 26b and 26c within the vessel 12 without departing from the spirit and scope of the invention.

It will be appreciated by those skilled in the art that other materials and forms of construction for the mounting members 26a, 26b, 26a, could be used without contaminating the fluids employed and which are able to withstand the harsh effects of the fluids. It is also understood by those skilled in the art that the number of mounting members 26a, 26b, 26c could be varied so long as the objects 24 are supported within the vessel 12 without the need for a cassette holder.

Figure 3:
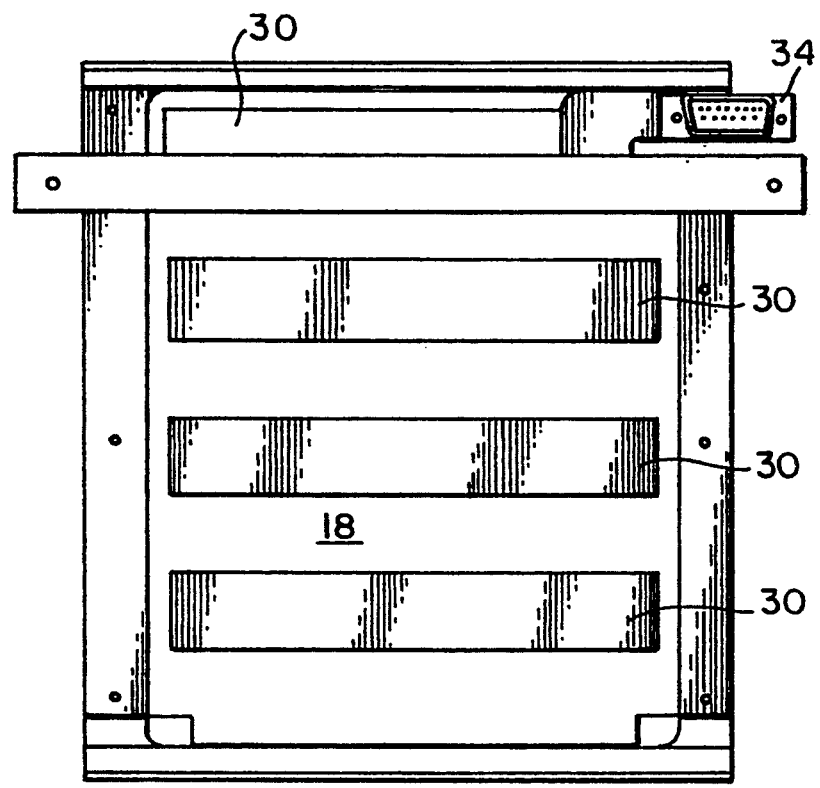
FIG. 3 is a front elevational view of the static megasonic cleaning system shown in FIG. 1.
Figure 4:
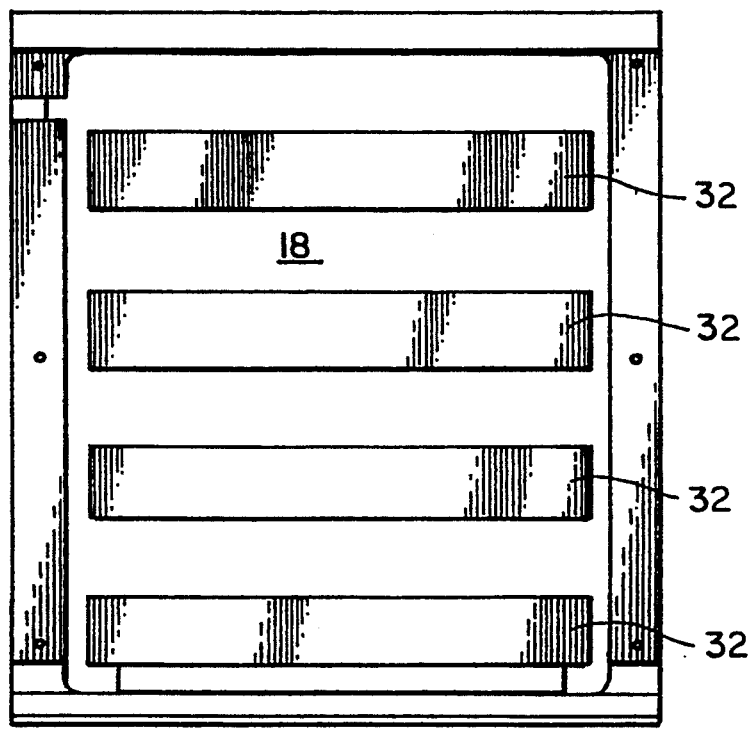
FIG. 4 is a rear elevational view of the static megasonic cleaning system shown in FIG. 1.

Referring now to FIGS. 1, 3 and 4, a first array 30 and a second array 32 of megasonic wave generating transducers are mounted on the vessel 12 outwardly of the internal surface 20. Each of the transducers 30, 32 is adapted to emit a focused beam of megasonic energy into the cavity 22. The transducers 30, 32 are arranged on the vessel 12 in an opposing manner on oppositely disposed walls 18 such that the emitted beams collectively envelop the entire exterior surface of each object 24.

In the present embodiment, it is preferred that each transducer 30, 32 be mounted on the vessel 12 such that each focused beam of megasonic energy passes directly from said internal surface 20 to the objects 24 without impacting upon the mounting members 26a, 26b, 26c. That is, the first array of transducers 30 are mounted on the wall 18 of the vessel 12 having the first mounting member 26a thereon such that the focused beam of energy passes directly from the internal surface 20 to the objects 24 without impacting upon the first mounting member 26a. Similarly, the second array of transducers 32 are mounted on the wall 18 of the vessel 12 having the third mounting member 26c thereon such that the focused beam of energy passes directly from the internal surface 20 to the objects 24 without impacting upon the third mounting member 26c.

As best shown in FIG. 1, the first array of transducers 30 is staggered with respect to the second array of transducers 32 such that the emitted beams extend generally parallel with respect to each other. Thus, by staggering the transducers 30, 32 the beams avoid the mounting members 26a, 26b, 26c and collectively envelop the objects 24 without dissipation caused by the intervening mounting structure of the vessel 12.

Each transducer 30, 32 has a power output of two hundred watts. The frequency is determined by the thickness of the walls 18. In the present embodiment, the walls 18 have a thickness of approximately 0.25 inches. This yields a frequency of 625 kHz, which is ideal to achieve maximum cleaning without endangering the integrity of the liner 25, as described in more detail hereinafter. It is understood by those skilled in the art that the power can be modified to achieve the preferred frequency depending upon the thickness of the wall 18. The megasonic wave generating transducers 30, 32 of the present invention are off-the-shelf items well known by those skilled in the art, and therefore, further description thereof is omitted for purposes of convenience only and is not limiting.

Preferably, the megasonic transducers 30, 32 are adhered to the walls 18 with a suitable adhesive. However, it is understood by those skilled in the art that the transducers 30, 32 can be secured to the walls 18 in any manner, such as with standard hardware, without departing from the spirit and scope of the invention. As best shown in FIG. 3, a conventional plug 34 is secured to the vessel 12 for connection to an appropriate energy source to energize the first and second arrays of transducers 30, 32 in a manner well understood by those skilled in the art.

In operation, the internal cavity 22 of the vessel 12 is filled with objects 24 to be cleaned by mounting the objects 24 at their peripheries within the grooves 28 of the mounting members 26a, 26b, 26c. Appropriate fluids (not shown) are pumped through the cavity 22 so that the objects 24 are immersed in the fluids in the manner described in the above-mentioned patents incorporated by reference. Cleaning of the objects 24 is achieved by energizing the transducers 30, 32 to transmit beams of high frequency energy through the walls 10 of the vessel 12, the liner 25 and the fluid. The fluid and objects 24 then vibrate at high frequencies causing impurities and other contaminants on the surfaces of the objects 24 to dislodge therefrom.

Preferably, the transducers 30, 32 are pulsed on and off at different times to prevent the liner 25 from melting. For instance, each transducer 30, 32 can be pulsed on for two or three seconds and then pulsed off for ten seconds to allow for a cool down period. It is preferred that one transducer from each of the first and second arrays of transducers 30, 32 be pulsed simultaneously to stagger the pulsing. The objects 24 are left in the cavity 22 until they have been subjected to sufficient megasonic energy to provide the desired cleaning caused by dislodgement of particles and impurities from the objects 24. Thus, the preferred embodiment provides a megasonic cleaning system which processes a plurality of objects 24 in a cassetteless vessel 12 containing one or more fluids without requiring the objects 24 to be moved within the vessel 12 to increase the exposure of the surfaces of the objects 12 to the megasonic energy.

From the foregoing description, it can be seen that the present invention comprises an improved megasonic cleaning system. It will be appreciated by those skilled in the art, that changes could be made to the embodiment described in the foregoing description without departing from the broad inventive concept thereof. It is understood, therefore, that this invention is not limited to the particular embodiment disclosed, but is intended to cover all modifications which are within the scope and spirit of the invention as defined by the appended claims.

We claim:

1. A static megasonic cleaning system for cleaning a plurality of objects having an exterior surface and a major plane, said system comprising:
   (a) a cassetteless vessel having an internal cavity for receiving the plurality of objects and for receiving a fluid, said internal cavity being defined by an internal surface; and
   (b) an array of megasonic transducers mounted on said vessel outwardly of said internal surface, each transducer emitting a focused beam of megasonic energy into said cavity, the plurality of transducers being arranged so that the emitted beams extend generally parallel to the major plane of the objects and collectively envelop the entire exterior surface of each object.

2. The cleaning system as recited in claim 1 wherein said internal surface is constructed of a material which is chemically inert with respect to said fluid.

3. The cleaning system as recited in claim 2 wherein said material is at least partially constructed of TEFLON ®.

4. The cleaning system as recited in claim 1 wherein said transducers are mounted on said vessel in an opposing manner.

5. A static megasonic cleaning system for cleaning a plurality of objects having an exterior surface and a major plane, said system comprising:
   (a) a cassetteless vessel having an internal cavity for receiving the plurality objects and for receiving a plurality of different fluids, said internal cavity being defined by an internal surface; and
   (b) an array of megasonic transducers mounted on said vessel outwardly of said internal surface, each transducer emitting a focused beam of megasonic energy into said cavity, the plurality of transducers being arranged so that the emitted beams extend generally parallel to the major plane of the objects and collectively envelop the entire exterior surface of each object.

6. The cleaning system as recited in claim 5 wherein said internal surface is constructed of a material which is chemically inert with respect to each of said fluids.

7. The cleaning system as recited in claim 6 wherein said material is at least partially constructed of TEFLON ®.

8. The cleaning system as recited in claim 5 wherein said transducers are mounted on said vessel in an opposing manner.

9. A static megasonic cleaning system for cleaning objects having a major plane, said system comprising:
   (a) a cassetteless vessel having an internal cavity for receiving the objects and for receiving a fluid, said internal cavity being defined by an internal surface, said vessel including at least two mounting members extending inwardly from and directly mounted on said internal surface for engaging and supporting the objects within the cavity, said mounting members being spaced with respect to each other; and
   (b) an array of megasonic transducers mounted on said vessel outwardly of said internal surface, each transducer emitting a focused beam of megasonic energy into said cavity generally parallel to the major plane of the objects, each transducer being mounted on said vessel such that each focused beam of megasonic energy passes directly from said internal surface to said objects without impacting upon said mounting members.

10. The cleaning system as recited in claim 9 wherein the array of transducers includes a plurality of transducers arranged so that the emitted beams collectively envelop the objects.

11. The cleaning system as recited in claim 9 wherein said vessel includes a longitudinal axis, said mounting members being spaced from each other along said longitudinal axis.

12. A static megasonic cleaning system for cleaning objects having a major plane, said system comprising:
   (a) a cassetteless vessel having a first end, a second end and four interconnected walls extending between said first and second ends, each of said walls having an internal surface, said internal surfaces defining an internal cavity for receiving the objects and a cleaning fluid;
   (b) a first mounting member extending inwardly from and directly mounted on said internal surface of one of said walls for engaging and supporting the objects within the cavity;
   (c) a second mounting member extending inwardly from and directly mounted on said internal surface of a second of said walls for engaging and supporting the objects within the cavity in combination with said first mounting member;
   (d) a first array of transducers mounted on said one of said walls outwardly of said internal surface thereof, each transducer of said first array emitting a focused beam of megasonic energy into said cavity generally parallel to the major plane of the objects and being mounted on said one of said walls such that the focused beam of energy passes directly from said internal surface of said one of said walls to said objects without impacting upon said first mounting member; and
   (e) a second array of transducers mounted on said second of said walls outwardly of said internal surface thereof, each transducer of said second array emitting a focused beam of megasonic energy into said cavity generally parallel to the major plane of the objects and being mounted on said second of said walls such that the focused beam of energy passes directly from said internal surface of said second of said walls to said objects without impacting upon said second mounting member.

13. The cleaning system as recited in claim 12 wherein the first and second array of transducers are arranged such that the emitted beams of megasonic energy collectively envelop the objects.

14. The cleaning system as recited in claim 12 wherein said first array of transducers is staggered with respect to said second array of transducers such that the emitted beams of said first and second array of transducers extend generally parallel with respect to each other.

15. The cleaning system as recited in claim 12 wherein said second of said walls is oppositely disposed from said one of said walls.

* * * * *